US008679988B2

(12) United States Patent
Lee et al.

(10) Patent No.: US 8,679,988 B2
(45) Date of Patent: Mar. 25, 2014

(54) PLASMA PROCESSING OF METAL OXIDE FILMS FOR RESISTIVE MEMORY DEVICE APPLICATIONS

(75) Inventors: Albert Lee, Cupertino, CA (US); Chi-I Lang, Cupertino, CA (US)

(73) Assignee: Intermolecular, Inc., San Jose, CA (US)

( * ) Notice: Subject to any disclaimer, the term of this patent is extended or adjusted under 35 U.S.C. 154(b) by 184 days.

(21) Appl. No.: 13/302,777

(22) Filed: Nov. 22, 2011

(65) Prior Publication Data

US 2013/0130464 A1 May 23, 2013

(51) Int. Cl.
*H01L 21/00* (2006.01)

(52) U.S. Cl.
USPC .......................................... 438/785; 257/296

(58) Field of Classification Search
USPC ............................... 438/3, 104, 257, 681, 785
See application file for complete search history.

(56) References Cited

U.S. PATENT DOCUMENTS

| 7,508,648 | B2 | 3/2009 | Ahn et al. | |
|---|---|---|---|---|
| 8,008,096 | B2 | 8/2011 | Fuchigami | |
| 2004/0009307 | A1* | 1/2004 | Koh et al. | 427/569 |
| 2008/0044569 | A1 | 2/2008 | Myo | |
| 2009/0302296 | A1* | 12/2009 | Fuchigami et al. | 257/2 |
| 2010/0167463 | A1 | 7/2010 | Sung | |
| 2010/0227476 | A1 | 9/2010 | Peck | |
| 2011/0193050 | A1* | 8/2011 | Takano et al. | 257/4 |

OTHER PUBLICATIONS

Kim et al.; Anodeinterface localized filamentary mechanism in resistive switching of TiO2 thin films; Jul. 6, 2007; American Institute of Physics; Applied Physics Letters Jul. 6, 2007 pp. 01290710129073 vol. 91.

Lee et al.; HfOx Biploar Resistive Memory with Robust Endurance Using AlCu as Buffer Electrode; Jul. 1, 2009; Industrial Technology Research Institute; IEEE Electron Device Letters vol. 30 No. 7 pp. 703705.

Lee et al.; Resistance Switching Behaviors of Hafnium Oxide Films Grown by MOCVD for Nonvolatile Memory Applications; Dec. 6, 2007; Pohang Institute of Science and Technology. Korea; Journal of the Electrochemical Society Dec. 6, 2007 pp. H92H96 vol. 155 2.

Chen, A., et al.; NonVolatile Resistive Switching for Advanced Memory Applications; Dec. 5, 2005; IEEE IEDM; Dec. 57 2005 4pp.

Chen, P., et al.; HfOx Thin Films for Resistive Memory Device by Use of Atomic Layer Deposition; Jan. 1, 2007; Industrial Technology Research Institute; Mater. Res. Soc. Symp. Proc. vol. 997 2007 Materials Research Society.

Chen, Y.S., et al.; Highly Scalable Hafnium Oxide Memory with Improvements of Resistive Distribution and Read Disturb Immunity; Jan. 1, 2009; Industrial Technology Research Institute; pp. IEDM09108.

Kim, S., et al.; Dielectric and Electrode Thin Films for StackCell Structured DRAM Capacitors with Sub 50nm Design Rules; Sep. 19, 2007; EMRS; Warsaw University of Technology.

(Continued)

*Primary Examiner* — William D Coleman
*Assistant Examiner* — Nicholas Tobergte

(57) ABSTRACT

In some embodiments, the present invention discloses plasma processing at interfaces of an ALD metal oxide film with top and bottom electrodes to improve the ReRAM device characteristics. The interface processing can comprise an oxygen inhibitor step with a bottom polysilicon electrode to prevent oxidation of the polysilicon layer, enhancing the electrical contact of the metal oxide film with the polysilicon electrode. The interface processing can comprise an oxygen enrichment step with a top metal electrode to increase the resistivity of the metal oxide layer, providing an integrated current limiter layer.

10 Claims, 7 Drawing Sheets

(56) References Cited

OTHER PUBLICATIONS

Kim, D.C., et al.; Electrical Observations of Filamentary Conductions for the Resistive Memory Switching in NiO Films; May 15, 2006; American Institute of Physics; Applied Physics Letters May 15, 2006 pp. 2021021 2021023 vol. 88.

Lee, Se-Hee, et al.; Effect of Nonstoichiometry of Nickel Oxides on Their Supercapacitor Behavior; Jan. 1, 2004; National Renewable Energy Laboratory; Electrochemical and SolidState Letters vol. 7 No. 10 pp. A299!301.

Lee, D., et al.; Resistance Switching of the Nonstoichiometric Zirconium Oxide for Nonvolatile Memory Applications; Oct. 1, 2005; IEEE; Electronic Device Letters vol. 26 No. 9 pp. 719721.

Kim, Y.M., et al.; Characteristics of Atomic Layer Deposition Grown HfO2 Films After Exposure to Plasma Treatments; Jan. 1, 2007; Kookje Electric Korea Co. Ltd; Thin Solid Films pp. 29842989.

Goldstein, D., et al.; Al2O3 Atomic Layer Deposition with Trimethylauminum and Ozone Studied by in Situ Transmission FTIR Spectroscopy and Quadrupole Mass Spectrometry; Jan. 1, 2008; The Regents of the University of Colorado; J. Phys. Chem pp. 1953019539.

Kim, S., et al.; Highly Durable and Flexible Memory Based on Resistance Switching; Jan. 1, 2010; Korea Advanced Institute of Science and Technology, Daejon, Korea; SolidState Electronics pp. 392396.

Bartholomew, L., et al.; Advanced Process Control of HfxSi1xO2 Composition Using Colnjection Atomic Layer Deposition; Jan. 1, 2009; The Electrochemical Society; ECS Transactions pp. 567574.

Yun, et al.; Dependence of atomic layerdeposited Al2O3 films characteristics on growth temperature and Al precursors of AlCH33 and AlCl3; Jan. 25, 1997; Vacuum Society; Semiconductor Technology Division Electronics and Telecommunications Research Institute.

Groner, M.D., et al.; Electrical characterization of thin Al2O3 films grown by atomic layer deposition on silicon and various metal substrates; Apr. 19, 2002; Z—Book—Elsevier; Thin Solid Films 413 186197.

Min, YS., et al.; Atomic Layer Deposition of Al2O3 Thin Films from a 1Methoxy2methyl2propoxide Complex of Aluminum and Water; Jan. 7, 2005; American Chemical Societyunknown; Chem. Mater. 2005 17 626631.

Kim, K. S. et al.; Low Temperature 100C Deposition of Aluminum Oxide Thin Films by ALD with O3 as Oxidant; Jan. 1, 2006; The Electrochemical Society; Journal of the Electrochemical Society 153 5 F69F76.

JD Ferguson et al.; ALD of SiO2 at Room Temperature Using TEOS and ?H?2?O with ?nh?3 as the Catalyst; Jan. 1, 2004; Journal of the Electrochemical Society.

Lee et al.; A fast highendurance and scalable nonvolatile memory device made from asymmetric Ta2O5xTaO2x bilayer structures; Jul. 10, 2011; Nature Materials.

\* cited by examiner

PLASMA PROCESSING OF METAL OXIDE FILMS FOR RESISTIVE MEMORY DEVICE APPLICATIONS

FIELD OF THE INVENTION

This invention relates generally to nonvolatile memory elements, and more particularly, to methods for forming resistive switching memory elements used in nonvolatile memory devices

BACKGROUND OF THE INVENTION

Nonvolatile memory elements are used in systems in which persistent storage is required. For example, digital cameras use nonvolatile memory cards to store images and digital music players use nonvolatile memory to store audio data. Nonvolatile memory is also used to persistently store data in computer environments. Nonvolatile memory is often formed using electrically-erasable programmable read only memory (EPROM) technology. This type of nonvolatile memory contains floating gate transistors that can be selectively programmed or erased by application of suitable voltages to their terminals.

As fabrication techniques improve, it is becoming possible to fabricate nonvolatile memory elements with increasingly smaller dimensions. However, as device dimensions shrink, scaling issues are posing challenges for traditional nonvolatile memory technology. This has led to the investigation of alternative nonvolatile memory technologies, including resistive switching nonvolatile memory.

Resistive memory device, e.g., resistive switching nonvolatile random access memory (ReRAM) is formed using memory elements that have two or more stable states with different resistances. Bistable memory has two stable states. A bistable memory element can be placed in a high resistance state or a low resistance state by application of suitable voltages or currents. Voltage pulses are typically used to switch the memory element from one resistance state to the other. Nondestructive read operations can be performed to ascertain the value of a data bit that is stored in a memory cell.

Resistive switching based on transition metal oxide switching elements formed of metal oxide films has been demonstrated. Although metal oxide films such as these exhibit bistability, the resistance of these films and the ratio of the high-to-low resistance states are often insufficient to be of use within a practical nonvolatile memory device. For instance, the resistance states of the metal oxide film should preferably be significant as compared to that of the system (e.g., the memory device and associated circuitry) so that any change in the resistance state change is perceptible. The variation of the difference in resistive states is related to the resistance of the resistive switching layer. Therefore, a low resistance metal oxide film may not form a reliable nonvolatile memory device. For example, in a nonvolatile memory that has conductive lines formed of a relatively high resistance metal such as tungsten, the resistance of the conductive lines may overwhelm the resistance of the metal oxide resistive switching element. Therefore, the state of the bistable metal oxide resistive switching element may be difficult or impossible to sense.

Similar issues can arise from integration of the resistive switching memory element with current steering elements, such as diodes and/or resistors. The resistance of the resistive switching memory element (at least in its high resistance state) is preferably significant compared to the resistance of the current steering elements, so that the unvarying resistance of the current steering element does not dominate the resistance of the switching memory element, and thus reduce the measurable difference between the "on" and "off" states of the formed memory device (e.g., logic states of the device). However, since the power that can be delivered to a circuit containing a series of resistive switching memory elements and current steering elements is typically limited in most conventional nonvolatile memory devices (e.g., CMOS driven devices), it is desirable to form each of the resistive switching memory elements and current steering elements in the circuit so that the voltage drop across each of these elements is small, and thus resistance of the series connected elements does not cause the current to decrease to an undesirable level due to the fixed applied voltage (e.g., about 2-5 volts).

As nonvolatile memory device sizes shrink, it is important to reduce the required currents and voltages that are necessary to reliably set, reset and/or determine the desired "on" and "off" states of the device to minimize resistive heating of the device and cross-talk between adjacent devices. Moreover, in cases where multiple formed memory devices are interconnected to each other and to other circuit elements it is desirable to minimize the device performance variation between one device to the next to assure that the performance of the formed circuit performs in a desirable manner.

Current ReRAM structures use thin film stacks of insulator materials, such as metal oxides (e.g., hafnium oxide) between metal electrodes to form a device that can be switched between two different stable resistance states by the application of appropriate voltages. In one class of cells, specifically bipolar ReRAMs, the switching is enabled by the back and forth movement of charged oxygen vacancies between the electrodes under the influence of the applied electrical field. In order for the cell to be able to switch reproducibly for many thousands of cycles, it is necessary that there always be a sufficient concentration of vacancies in the bulk of the metal oxide film. The interface between the electrode and the metal oxide bulk film is a region in which vacancies may be trapped and eventually be removed from the metal oxide bulk film. This is especially true when reactive metal surfaces or boundary regions have large structural changes relative to the metal oxide bulk film.

Therefore, there is a need for an effective interface that is separate from the electrode interface but does not substantially alter the switching properties of the metal oxide bulk film, as well as a need for an efficient and controllable process to form such metal oxide bulk film for a nonvolatile memory device.

SUMMARY OF THE PREFERRED EMBODIMENTS

In some embodiments, the present invention discloses processing at interfaces of a metal oxide film with top and bottom electrodes to improve the ReRAM device characteristics. The interface processing can comprise plasma processing, and preferably comprises plasma enhanced atomic layer deposition (ALD) process, for example, at the beginning and the end of the metal oxide film deposition.

In some embodiments, the present invention discloses an oxygen inhibitor step at the interface of the metal oxide and a bottom polysilicon electrode. Oxygen inhibitor processing at an exposed polysilicon surface can prevent oxidation of the polysilicon layer, enhancing the electrical contact of the metal oxide film with the polysilicon electrode. In some embodiments, during a stage of the metal oxide deposition, a plasma ambient is provided to engineer the interface between the bottom polysilicon electrode and the metal oxide layer. For example, during a number of first ALD cycles of ALD metal oxide deposition, the polysilicon surface is exposed to a plasma, such as a hydrogen plasma, to inhibit oxidation of the polysilicon surface. In some embodiments, hydrogen plasma is provided during the oxidation step of ALD metal oxide during the first 5 to 10 cycles, for example, by adding or replacing the oxidation step with a hydrogen plasma step. In some embodiments, a layer of metal-rich metal oxide or oxygen-poor metal oxide can be formed at the interface of the polysilicon electrode and the metal oxide switching layer, in addition to a good contact between the polysilicon electrode and the metal oxide layer.

In some embodiments, the present invention discloses an oxygen enrichment step at the interface of the metal oxide and a top metal electrode. Oxygen enrichment processing at an exposed metal oxide surface can increase the resistivity of the metal oxide layer, providing an integrated current limiter layer. In some embodiments, during a stage of the top metal electrode deposition, a plasma ambient is provided to engineer the interface between the metal oxide layer and the top electrode layer. For example, during a number of last ALD cycles of ALD metal oxide deposition, the metal oxide is exposed to a plasma, such as an oxygen plasma to engineer a more oxygen-rich, resistive metal oxide layer. Alternatively, the metal oxide can be exposed to a plasma comprising an inert gas to densify the top portion of the metal oxide layer. In some embodiments, oxygen plasma is provided during the oxidation step of ALD metal oxide during the last 5 to 20 cycles, for example, by adding or replacing the oxidation step with an oxygen plasma step. In some embodiments, inert plasma is provided after every last cycles, every few last cycles, or after the metal oxide deposition is completed to densify the metal oxide layer. In some embodiments, a layer of oxygen-rich metal oxide or a stoichiometric metal oxide can be formed at the interface of the metal oxide switching layer and the top metal electrode, providing a current limiter layer for the ReRAM device.

BRIEF DESCRIPTION OF THE DRAWINGS

To facilitate understanding, identical reference numerals have been used, where possible, to designate identical elements that are common to the figures. The drawings are not to scale and the relative dimensions of various elements in the drawings are depicted schematically and not necessarily to scale.

The techniques of the present invention can readily be understood by considering the following detailed description in conjunction with the accompanying drawings, in which.

DETAILED DESCRIPTION OF THE PREFERRED EMBODIMENTS

Figure 1:
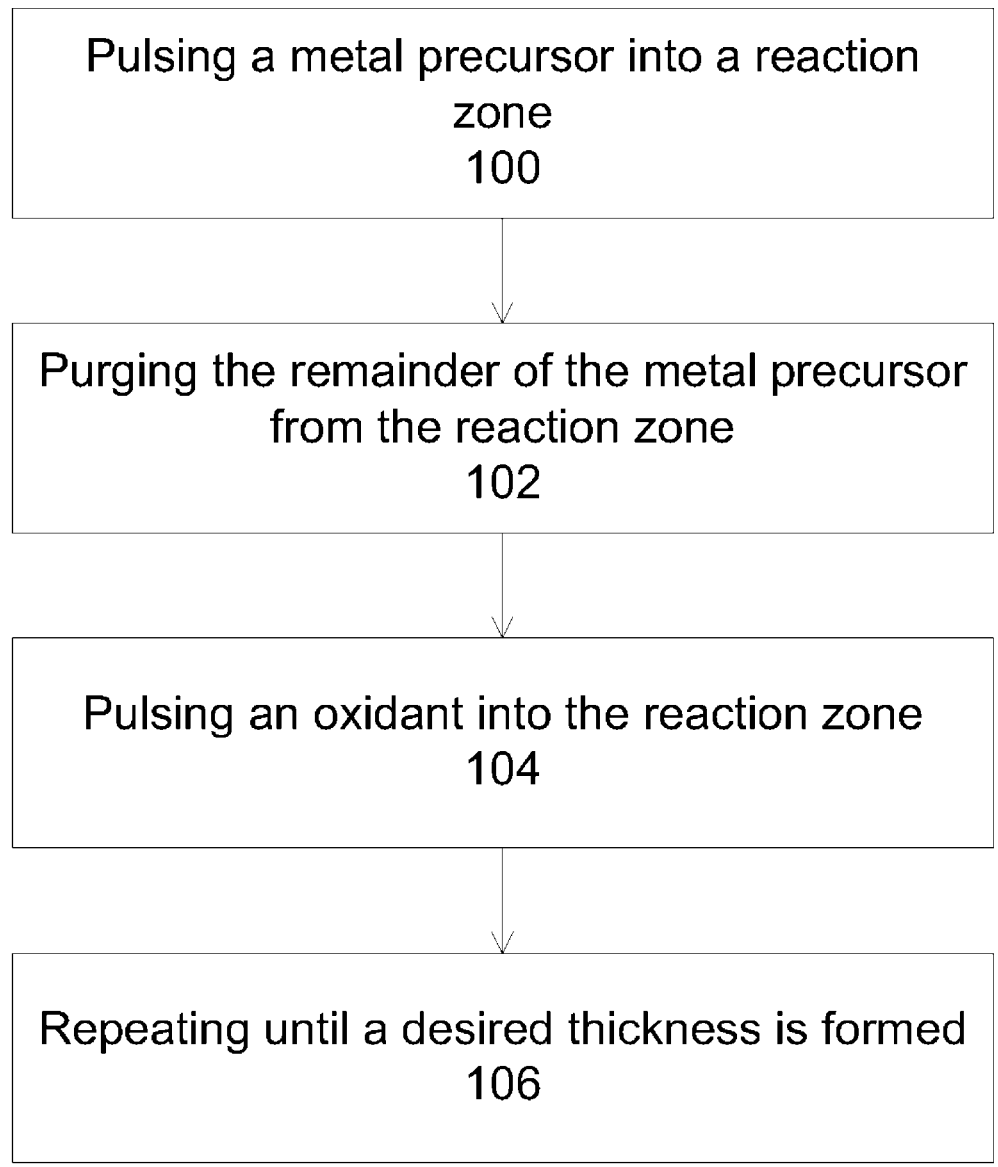
FIG. 1 illustrates a flow chart of an ALD deposition of metal oxide dielectric materials according to some embodiments of the present invention.

A detailed description of one or more embodiments is provided below along with accompanying figures. The detailed description is provided in connection with such embodiments, but is not limited to any particular example. The scope is limited only by the claims and numerous alternatives, modifications, and equivalents are encompassed. Numerous specific details are set forth in the following description in order to provide a thorough understanding. These details are provided for the purpose of example and the described techniques may be practiced according to the claims without some or all of these specific details. For the purpose of clarity, technical material that is known in the technical fields related to the embodiments has not been described in detail to avoid unnecessarily obscuring the description.

In some embodiments, the present invention discloses resistive-switching memory elements using resistive-switching metal oxide layers. For example, a metal-insulator-metal (MIM) memory element can be formed from two electrodes and one or more layers of one or more metal oxides disposed therebetween. Embodiments described herein provide methods for forming improved memory devices, such as a ReRAM cells, and also provide optimized, atomic layer deposition (ALD) processes for forming metal oxide film stacks.

In some embodiments, the present invention discloses an improved metal oxide layer suitable for use in a memory device based upon controlled change of resistance, and a method for making such a layer. More specifically, an interface treatment process may be used to condition the metal oxide layer at the interface with the top and bottom electrodes in a predictable, controlled manner, which can lead to greater yield and more predictable operation. The interface processing between the metal oxide layer and one or both of the electrodes are generally configured to adjust the nonvolatile memory device's performance, such as lowering the formed device's switching currents, lowering the required operating voltage, increasing the operation current ratio (ION/IOFF), reducing the device's forming voltage, and reducing the performance variation from one formed device to another. In general, the interface processing comprises a plasma process using hydrogen, oxygen or inert gas, at the beginning and the end of the metal oxide film deposition, which can control the stoichiometry of the metal oxide switching layer for improved switching properties, or can limit the current used to switch the metal oxide layer between "on" and "off" states.

In some embodiments, an interface coupling region can be formed from the interface processing discussed above, and which has a thickness less than about 30 angstroms (Å), such as between about 5 and about 30 Å.

In some embodiments, the present invention discloses forming the metal oxide layers using atomic layer deposition (ALD). Certain ALD process parameters can be optimized to reduce the forming voltage and increase the site yield of memory elements described herein. For example, a plasma process can be added to the ALD oxidation steps of the beginning or the end of the metal oxide layer deposition process.

Some of the materials and/or layers of the metal oxide film stack may be deposited or otherwise formed using a variety of deposition techniques, but in many embodiments described herein, all of the materials and/or layers of metal oxide film stack may be deposited using thermal ALD processes and/or plasma-enhanced ALD (PE-ALD). In one embodiment, a metal-rich oxide material may be formed by a metal-rich oxidizing ALD process utilizing plasma hydrogen and an oxygen-rich metal oxide material may be formed by a metal-poor oxidizing ALD process utilizing an activated oxygen agent, such as ozone, atomic oxygen, oxygen plasma, derivatives thereof, or combinations thereof.

The ALD processes for depositing or otherwise forming metal oxide materials contained within the metal oxide film stack and other materials and/or layers within the memory device are typically conducted in a deposition chamber, such as an ALD chamber. The deposition chamber may maintain an internal pressure of less than 760 Torr, such as within the range from about 10 mTorr to about 10 Torr, such as from about 100 mTorr to about 1 Torr, for example, about 350 mTorr. The temperature of the memory device, the substrate, or the substrate carrier/pedestal is usually maintained within the range from about 50° C. to about 1,000° C., such as from about 100° C. to about 500° C., such as from about 200° C. to about 400° C., or such as from about 250° C. to about 300° C.

The metal source gas may be pulsed, introduced, or otherwise provided into the deposition chamber at a flow rate within the range from about 0.1 sccm to about 200 sccm, such as from about 0.5 sccm to about 50 sccm, from about 1 sccm to about 30 sccm, for example, about 10 sccm. The metal source gas may be provided along with a carrier gas, such as argon or nitrogen. The carrier gas may have a flow rate within the range from about 1 sccm to about 300 sccm, such as from about 2 sccm to about 80 sccm, from about 5 sccm to about 40 sccm, for example, about 20 sccm.

The metal source gas may be pulsed or otherwise provided into the deposition chamber at a rate within a range from about 0.01 seconds to about 10 seconds, depending on the particular process conditions, metal source gas or desired composition of the deposited metal oxide material. In one embodiment, such as for forming a metal-poor oxide material, the metal source gas may be pulsed, introduced, or otherwise provided into the deposition chamber at a rate within a range from about 1 second to about 10 seconds, such as from about 1 second to about 5 seconds, for example, about 3 seconds. In another embodiment, such as for forming a metal-rich oxide material, the metal source gas may be pulsed, introduced, or otherwise provided into the deposition chamber at a rate within a range from about 0.05 seconds to about 2 seconds, such as from about 0.1 seconds to about 1 second, for example, about 0.5 seconds. In many examples, the metal source gas is a metal organic precursor comprising an organic ligand. For example, the metal source can be a hafnium precursor which is a tetrakis(dialkylamino)hafnium compound, such as tetrakis(dimethylamino) hafnium (($Me_2N$)$_4$Hf or TDMAH), tetrakis(diethylamino) hafnium (($Et_2N$)$_4$Hf or TDEAH), or tetrakis(ethylmethylamino) hafnium (($EtMeN$)$_4$Hf or TEMAH).

The metal source gas is generally dispensed into a deposition chamber by introducing a carrier gas through an ampoule containing the metal source or metal organic precursor. An ampoule unit may include an ampoule, a bubbler, a canister, a cartridge, or other container used for storing, containing, or dispersing chemical precursors. In another example, the ampoule may contain a liquid precursor (e.g., TDMAH or TDEAH) and be part of a liquid delivery system containing injector valve system used to vaporize the liquid precursor with a heated carrier gas. Generally, the ampoule may be heated to a temperature of about 100° C. or less, such as within a range from about 30° C. to about 90° C., for example, about 50° C.

The oxidizing agent (e.g., $O_2$, $O_3$, $H_2O$) may be pulsed, introduced, or otherwise provided into the deposition chamber at a flow rate within a range from about 0.01 seconds to about 10 seconds, depending on the particular process conditions, oxygen source gas or oxidizing agent or desired composition of the deposited metal oxide material. In one embodiment, such as for forming a metal-poor oxide material, the oxidizing agent may be pulsed, introduced, or otherwise provided into the deposition chamber at a rate within a range from about 0.001 seconds to about 1 second, such as from about 0.001 seconds to about 0.1 seconds, for example, about 0.05 seconds.

In some embodiments, such as for forming a metal-rich oxide material, the oxidizing agent may be pulsed, introduced, or otherwise provided into the deposition chamber at a rate within a range from about 0.5 second to about 10 seconds, such as from about 1 second to about 3 seconds, for example, about 2 seconds. In some embodiments, oxygen inhibitor (e.g., hydrogen) may be introduced to the deposition chamber, in addition to, or replace the oxidizing agent. For example, the oxygen inhibitor contains active hydrogen can be formed by a plasma generated within the interior of the deposition chamber. Hydrogen gas flowed or directed into the deposition chamber, then ignited or formed into atomic hydrogen or excited hydrogen before being sequentially exposed along with the metal source gas to the substrate surface.

The oxidizing agent may contain or be formed of or generated from an oxygen source that includes oxygen ($O_2$), atomic oxygen (O), ozone ($O_3$), nitrous oxide ($N_2O$), nitric oxide (NO), nitrogen dioxide ($NO_2$), dinitrogen pentoxide ($N_2O_5$), hydrogen peroxide ($H_2O_2$), derivatives thereof, plasmas thereof, or combinations thereof. Ozone may be formed inside or outside of the deposition chamber, such as the ALD chamber. In some embodiments, the oxidizing agent contains ozone formed by an ozone generator positioned outside of the interior of the deposition chamber. Ozone is generated and then flowed or directed into the deposition chamber and exposed along with the metal source gas to the substrate surface. In some embodiments, the oxidizing agent contains ozone formed by a plasma generated within the interior of the deposition chamber. Oxygen gas flowed or directed into the deposition chamber, then ignited or formed into ozone and/or atomic oxygen before being sequentially exposed along with the metal source gas to the substrate surface.

A carrier gas or a purge gas may be provided at the same time as the metal source gas and/or the oxygen source, but is also provided between the pulses of the metal source gas and/or the oxygen source. The carrier gas or purge gas may flow continuously during the ALD process or may be intermediately and/or sequentially pulsed, introduced, or otherwise provided during the ALD. The carrier gas or purge gas may be pulsed, introduced, or otherwise provided into the deposition chamber at a rate within a range from about 1 second to about 30 seconds, depending on the particular process conditions, source gases, or desired composition of the deposited metal oxide material. In some embodiments, the carrier gas or a purge gas may be pulsed, introduced, or otherwise provided into the deposition chamber at a rate within a range from about 1 second to about 30 seconds, such as from about 2 seconds to about 20 seconds, for example, about 10 seconds or about 15 seconds.

The carrier gas or purge gas may contain nitrogen, argon, helium, hydrogen, a forming gas, oxygen, mixtures thereof, or combinations thereof. The carrier gas or the purge gas may be sequentially pulsed, introduced, or otherwise provided after each pulse of the metal source gas and each pulse of the oxidizing agent during the ALD cycle. The pulses of purge gas or carrier gas are typically pulsed, introduced, or otherwise provided at a flow rate within a range from about 2 standard liters per minute (slm) to about 22 slm, such as about 10 slm. The specific purge gas flow rates and duration of process cycles are obtained through experimentation. In some embodiments, a 300 mm diameter wafer requires about twice the flow rate for the same duration as a 200 mm diameter wafer in order to maintain similar throughput.

ALD as used herein refers to the sequential introduction of two or more reactive compounds to deposit a layer of material on a substrate surface. The two, three or more reactive compounds may alternatively be introduced into a reaction zone of a deposition chamber. Usually, each reactive compound is separated by a time delay to allow each compound to adhere and/or react on the substrate surface. In some embodiments, a first precursor or compound A is pulsed into the reaction zone of a deposition chamber (e.g., ALD chamber) followed by a first time delay. Next, a second precursor or compound B is pulsed into the reaction zone followed by a second delay. During each time delay a purge gas, such as argon or nitrogen, may be pulsed or otherwise provided into the deposition chamber to purge the reaction zone or otherwise remove any residual reactive compound or by-products from the reaction zone or other surfaces. Alternatively, the purge gas may flow continuously throughout the deposition process so that only the purge gas flows during the time delay between pulses of reactive compounds. The reactive compounds are alternatively pulsed until a desired film or film thickness is formed on the substrate or deposition. In either scenario of a continuous or intermittent purge gas flow, the ALD process of pulsing compound A, purge gas, pulsing compound B, and purge gas is an ALD cycle. An ALD cycle can start with either compound A or compound B and continue the respective order of the ALD cycle until achieving a film with the desired thickness. In some embodiments, a first precursor or compound A is pulsed into the reaction zone of a deposition chamber (e.g., ALD chamber) followed by a first time delay. Next, a second precursor or compound B is pulsed into the reaction zone followed by a second delay. Next, a third precursor or compound C is pulsed into the reaction zone followed by a third delay. During each time delay a purge gas, such as argon or nitrogen, may be pulsed or otherwise provided into the deposition chamber to purge the reaction zone or otherwise remove any residual reactive compound or by-products from the reaction zone or other surfaces. Alternatively, the purge gas may flow continuously throughout the deposition process so that only the purge gas flows during the time delay between pulses of reactive compounds. The reactive compounds are alternatively pulsed until a desired film or film thickness is formed on the substrate or deposition surface. In either scenario of a continuous or intermittent purge gas flow, the ALD process of pulsing compound A, purge gas, pulsing compound B, purge gas, pulsing compound C, and purge gas is an ALD cycle. Alternatively, the ALD process of pulsing compound A, purge gas, pulsing compound B, purge gas, pulsing compound C, purge gas, pulsing compound B, and purge gas is an ALD cycle. An ALD cycle can start with either compound A, compound B, or compound C and continue the respective order of the ALD cycle until achieving a film with the desired thickness.

A "pulse" as used herein is intended to refer to a quantity of a particular compound that is intermittently or non-continuously introduced into a reaction zone of a processing chamber. The quantity of a particular compound within each pulse may vary over time, depending on the duration of the pulse. The duration of each pulse is variable depending upon a number of factors such as, for example, the volume capacity of the deposition chamber employed, the vacuum system coupled thereto, and the volatility/reactivity of the particular compound itself. A "half-reaction" as used herein is intended to refer to a pulse of precursor step followed by a purge step.

FIG. 1 illustrates a flow chart of an ALD deposition of metal oxide dielectric materials according to some embodiments of the present invention. In step 100, a metal precursor is pulsed into the reaction zone. A portion of the precursor adsorbs onto the surface at reactive sites. In step 102, the remainder of the precursor is purged from the reaction zone. In step 104, an oxidant is then pulsed into the reaction zone to react with the adsorbed precursor and form a metal oxide dielectric material. In step 106, this sequence is repeated until the desired thickness of the metal oxide dielectric material is formed. Examples of suitable metal oxide dielectric materials include hafnium oxide ($Hf_xO_y$), tantalum oxide ($Ta_xO_y$), aluminum oxide ($Al_xO_y$), lanthanum oxide ($La_xO_y$), yttrium oxide ($Y_xO_y$), dysprosium oxide ($Dy_xO_y$), ytterbium oxide ($Yb_xO_y$), zirconium oxide ($Zr_xO_y$), titanium oxide ($TiO_x$), nickel oxide ($NiO_x$), cerium oxide ($CeO_x$), zinc oxides ($Zn_xO_y$), copper oxides ($Cu_xO_y$), with their stoichiometric, nonstoichiometric and doped variants can be used.

In some embodiments, a memory element can be formed using an aluminum oxide layer. The metal precursor can comprise a metal organic precursor of trimethylaluminum. The oxidant can comprise water, oxygen or ozone. The deposition temperature can be from 50 to 250° C.

Figure 2A:
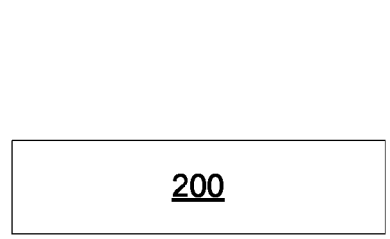
FIGS. 2A-2F illustrate an exemplary process flow schematic of an ALD deposition of an exemplary aluminum oxide according to some embodiments of the present invention.
Figure 2B:
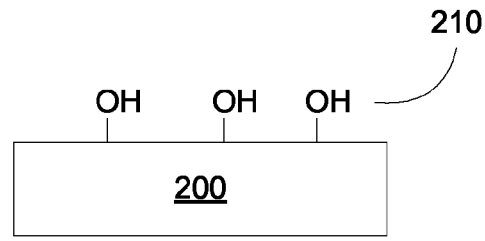

FIGS. 2A-2F illustrate an exemplary process flow schematic of an ALD deposition of an exemplary aluminum oxide according to some embodiments of the present invention. In FIG. 2A, a substrate 200 is provided in a process chamber. The substrate can be a semiconductor substrate or a support substrate. In some embodiments, the substrate 200 is already processed to form appropriate structures for resistive memory devices. For example, a polysilicon layer can be formed on the substrate 200, acting as a bottom electrode for the to-be-deposited aluminum oxide switching layer. In FIG. 2B, the substrate surface is conditioned for ALD deposition, for example, by providing an OH terminated surface 210. The OH surface 210 can be prepared by exposing the substrate to water.

Figure 2C:
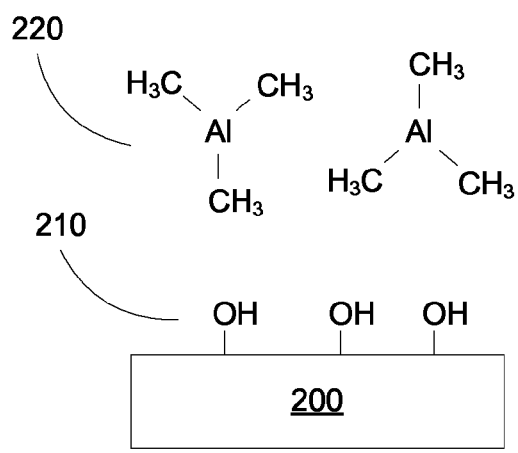
Figure 2D:
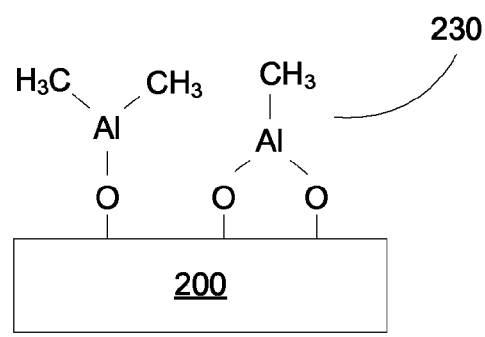
Figure 2E:
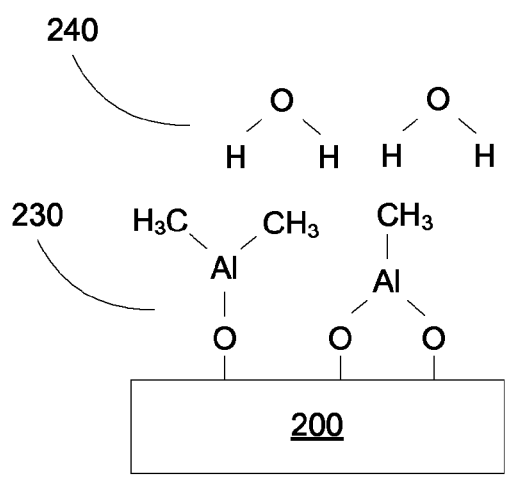
Figure 2F:
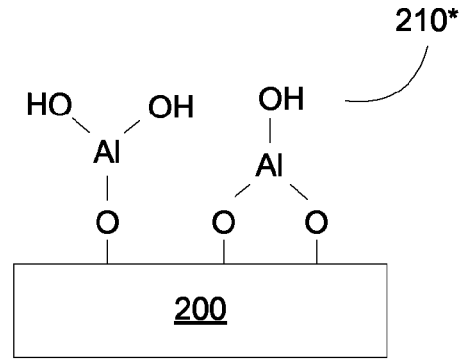

In FIG. 2C, trimethylaluminum ($Al(CH_3)_3$) precursor 220 is introduced to the process chamber. In FIG. 2D, trimethylaluminum precursor reacts with the OH surface to form aluminum oxide bonding 230. The un-reacted trimethylaluminum precursor is purged from the chamber. In FIG. 2E, water 240 is introduced to the process chamber. In FIG. 2F, water molecules react with aluminum surface 230 to conditioning the substrate surface to OH terminated surface 210\*. The process cycle continues, for example, by introducing trimethylaluminum precursor to react with OH terminated surface.

In some embodiments, the present invention discloses forming a metal oxide switching layer on a bottom electrode. An oxygen inhibitor step at the interface of the metal oxide and a bottom electrode can prevent oxidation of the bottom electrode, such as a polysilicon layer, enhancing the electrical contact of the metal oxide film with the polysilicon electrode. For example, during a number of first ALD cycles of ALD metal oxide deposition, a plasma step can be provided to engineer the interface of the metal oxide with the polysilicon electrode, such as inhibiting oxidation of the polysilicon surface.

In some embodiments, the present invention discloses a method to form a memory element for a ReRAM device, comprising providing a bottom electrode; depositing a bottom interface layer of metal oxide on the electrode using an ALD process comprising alternating a metal-containing precursor and a hydrogen-containing plasma; and depositing a bulk layer of metal oxide on the bottom interface layer using an ALD process comprising alternating the metal-containing precursor and an oxidant. In some embodiments, the bottom electrode can comprise polysilicon or metal. The bottom interface layer can comprise metal-rich or oxygen-poor metal oxide. The ALD process for depositing a bottom interface layer can further comprise the oxidant, and can comprise between 5 to 10 ALD cycles.

In some embodiments, hydrogen plasma is used to replace the oxidation step of ALD metal oxide during a first number of cycles. For example, the first few cycles, e.g., 5-10 cycles, of the deposition of the metal oxide layer comprise a sequence of introducing metal-containing precursor, such as a metal organic precursor, purging the metal-containing precursor, and introducing hydrogen plasma. The hydrogen plasma interface process can generate a metal layer on the polysilicon electrode, forming a good contact for the subsequent metal oxide switching layer.

In some embodiments, hydrogen plasma is added to the oxidation step of ALD metal oxide during a first number of cycles. The hydrogen plasma can be added before the oxidation step. For example, the first few cycles, e.g., 5-10 cycles, of the deposition of the metal oxide layer comprise a sequence of introducing metal-containing precursor, purging the metal-containing precursor, introducing hydrogen plasma, and introducing oxygen-containing precursor. Alternatively, the hydrogen plasma can be added after the oxidation step. For example, the first few cycles, e.g., 5-10 cycles, of the deposition of the metal oxide layer comprise a sequence of introducing metal-containing precursor, purging the metal-containing precursor, introducing oxygen-containing precursor, and introducing hydrogen plasma. In addition, the plasma hydrogen can be added to the oxidation step. For example, the first few cycles, e.g., 5-10 cycles, of the deposition of the metal oxide layer comprise a sequence of introducing metal-containing precursor, purging the metal-containing precursor, introducing a plasma containing oxygen-containing precursor and hydrogen-containing gases.

In some embodiments, the oxidation step of the metal oxide ALD can be configured to generate an oxygen-poor deposition, in addition to the addition of plasma processing for inhibiting oxygen reaction at the metal oxide/polysilicon interface. In some embodiments, the hydrogen plasma is generated by introducing a hydrogen-containing gas to a plasma ambient, such as pure hydrogen gas, a mixture of hydrogen and nitrogen, or a mixture of hydrogen and an inert gas. In some embodiments, other plasma gases can be used to replace the hydrogen plasma which can inhibit oxidation of polysilicon. In some embodiments, the number of first cycles is controlled to achieve a memory device having optimized characteristics.

In some embodiments, the present invention discloses forming a metal electrode on the metal oxide switching layer. An oxygen enrichment step at the interface of the metal oxide and a top metal electrode can increase the resistivity of the metal oxide layer, providing an integrated current limiter layer. For example, during a number of last ALD cycles of ALD metal oxide deposition, a plasma step can be provided to engineer the interface of the metal oxide with the metal electrode, such as forming a more oxygen-rich, resistive metal oxide layer or a stoichiometry metal oxide.

In some embodiments, the present invention discloses a method to form a memory element for a ReRAM device, comprising depositing a bulk layer of metal oxide on a substrate using an ALD process comprising alternating a metal-containing precursor and an oxidant; and depositing a top interface layer of metal oxide on the bulk layer using an ALD process comprising alternating the metal-containing precursor and an oxygen-containing plasma. In some embodiments, the oxidant can comprise water, oxygen or ozone. The ALD process for depositing a top interface layer can further comprise the oxidant, and can comprise between 5 to 20 ALD cycles. The top interface layer can comprise stoichiometric, metal-poor, or oxygen-rich metal oxide.

In some embodiments, oxygen plasma is used to replace the oxidation step of ALD metal oxide during a last number of cycles. For example, the last few cycles, e.g., 5-20 cycles, of the deposition of the metal oxide layer comprise a sequence of introducing metal-containing precursor, such as a metal organic precursor, purging the metal-containing precursor, and introducing oxygen plasma. The oxygen plasma interface process can generate a high resistive metal layer, forming a current limiter layer for the ReRAM device. The oxygen plasma can be generated by introducing an oxygen-containing precursor to a plasma ambient.

In some embodiments, oxygen plasma is added to the oxidation step of ALD metal oxide during a last number of cycles. The oxygen plasma can be added before or after the oxidation step. For example, the last few cycles, e.g., 5-20 cycles, of the deposition of the metal oxide layer comprise a sequence of introducing metal-containing precursor, purging the metal-containing precursor, introducing oxygen plasma, and introducing oxygen-containing precursor. Alternatively, the sequence can comprise introducing metal-containing precursor, purging the metal-containing precursor, introducing oxygen-containing precursor, and introducing oxygen plasma.

In some embodiments, inert plasma is added to the oxidation step of ALD metal oxide during a last number of cycles. The inert plasma can comprise introducing an inert gas to a plasma ambient, for example, to densify the metal oxide layer after the metal oxide deposition is completed.

In some embodiments, the oxidation step of the metal oxide ALD can be configured to generate a metal oxide having a richer oxygen component, in addition to the addition of the oxygen plasma. In some embodiments, the oxygen plasma is generated by introducing an oxygen-containing gas to a plasma ambient, such as pure oxygen gas, a mixture of oxygen and nitrogen or an inert gas, or an oxygen-containing gas such as water vapor, $CO_2$, $N_2O$. In some embodiments, the number of last cycles is controlled to achieve a memory device having optimized characteristics.

In some embodiments, the present invention discloses a method to form a memory element for a ReRAM device, comprising forming a bottom interface layer and a top interface layer sandwiching a variable resistance metal oxide layer. In some embodiments, an exemplary method comprises providing a bottom electrode; depositing a bottom interface layer of metal oxide on the electrode using an ALD process comprising alternating a metal-containing precursor and a hydrogen-containing plasma; depositing a bulk layer of metal oxide on the bottom interface layer using an ALD process comprising alternating the metal-containing precursor and an oxidant; and depositing a top interface layer of metal oxide on the bulk layer using an ALD process comprising alternating the metal-containing precursor and an oxygen-containing plasma. In some embodiments, the method can further comprise depositing a top electrode on the top interface layer. The bottom electrode can comprise polysilicon or metal. The bottom interface layer can comprise metal-rich or oxygen-poor metal oxide. The ALD process for depositing a bottom interface layer can further comprise the oxidant, and can comprise between 5 to 10 ALD cycles. The oxidant can comprise water, oxygen or ozone. The ALD process for depositing a top interface layer can further comprise the oxidant, and can comprise between 5 to 20 ALD cycles. The top interface layer can comprise stoichiometric, metal-poor, or oxygen-rich metal oxide.

The described ALD processes are techniques for depositing ultra-thin metal oxide films due to practical advantages which includes simple and accurate thickness control, precise control of dopant/element concentrations and distributions, excellent reproducibility and uniformity, and capability to produce conformal films at sharp interfaces and trenches with high aspect ratio.

Figure 3:
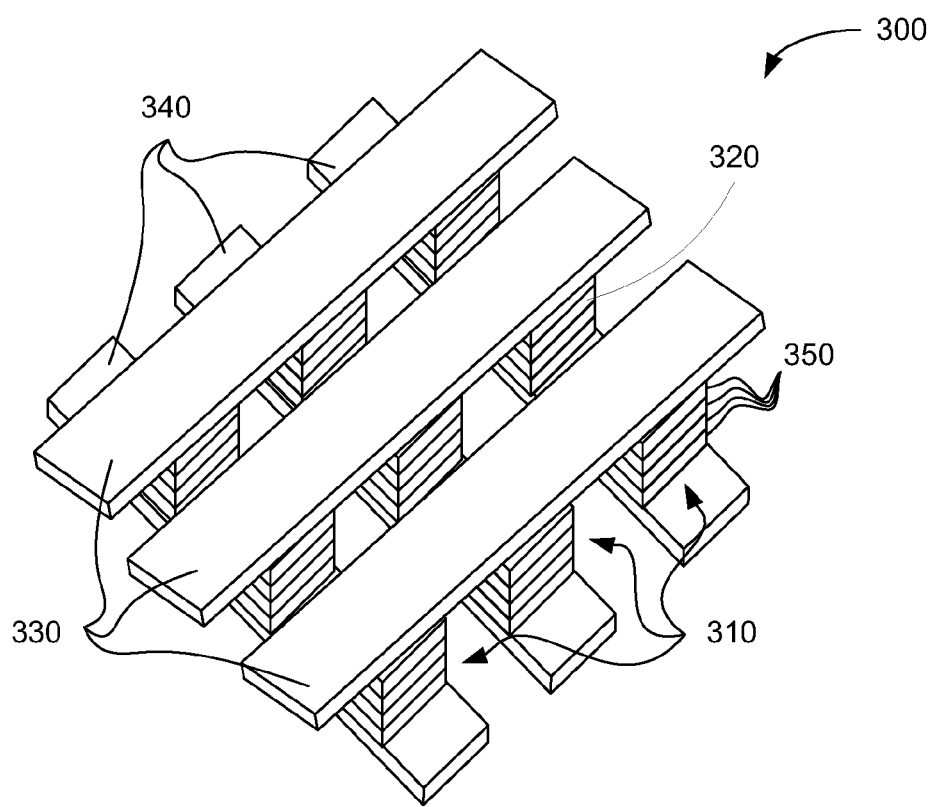
FIG. 3 illustrate an exemplary memory array according to some embodiments of the present invention.

FIG. 3 illustrates an exemplary memory array according to some embodiments of the present invention. A memory array 300 comprises a plurality of nonvolatile resistive switching memory devices 310 (hereafter switching memory device 310), which each generally include at least one resistive switching memory element 320. Memory array 300 may be part of a larger memory device or other integrated circuit structure, such as a system on a chip type device. Read and write circuitry is connected to switching memory devices 310 using word-lines and orthogonal bit-lines, which are referred to herein generally as electrodes 330 and 340, and are used to read from or write data into the memory element 320. Electrodes 330 and 340, generally include one or more conductive layers that each have a desired function in the array of switching memory devices 310. In some configurations, the electrodes 330 and 340 each comprise two or more conductive layers in which a first conductive layer is used to interconnect the multiple switching memory devices 310 and a second conductive layer is disposed in each switching memory device 310 to provide a desirable electrical interface (e.g., desirable work function) to the adjacent components in the switching memory device 310. Individual switching memory devices 310 or groups of switching memory devices 310 can be accessed using appropriate sets of word-lines and bit-lines, or electrodes 330 and 340. The memory elements 320 in the switching memory devices 310 may be formed from one or more layers 350 of materials, as schematically indicated. In addition, memory arrays such as memory array 300 can be stacked in a vertical fashion to make multilayer memory array structures. The use of resistive switching memory elements to form memory arrays is merely illustrative, and one skilled in the art will appreciate that the formed devices may be used in other device applications without deviating from the basic scope of the invention described herein.

Figure 4:
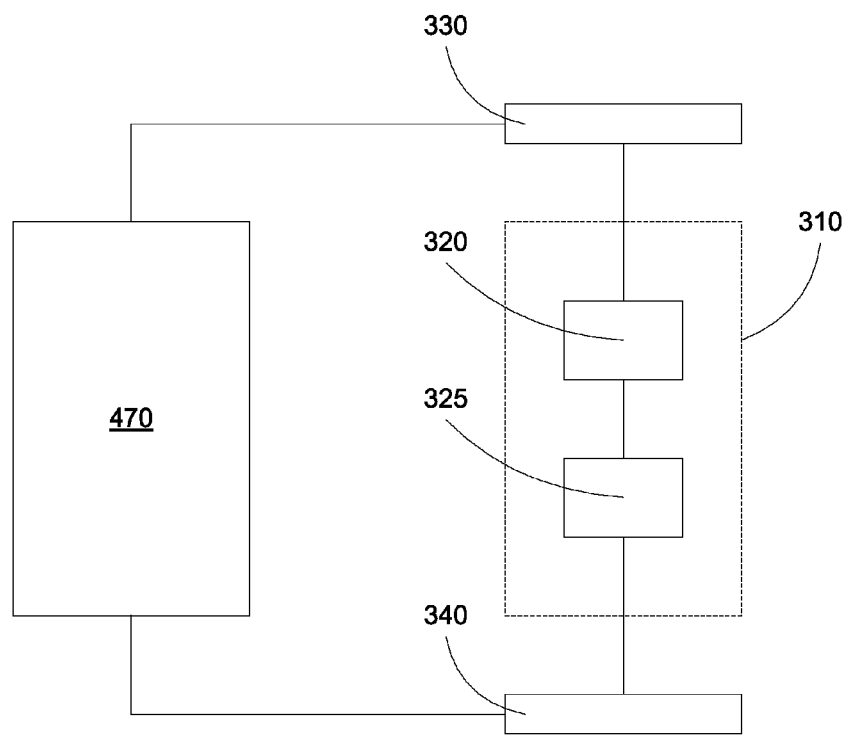
FIG. 4 illustrates an exemplary memory device according to some embodiments of the present invention.

FIG. 4 illustrates an exemplary memory device according to some embodiments of the present invention. A switching memory device 310 is shown that contains a memory element 320 and an optional current steering device 325, which are both disposed between the electrodes 330 and 340. In one configuration, the current steering device 325 is an intervening electrical component, such as a p-n junction diode, p-i-n diode, transistor, or other similar device that is disposed between electrode 330 and memory element 320, or between the electrode 340 and memory element 320. In some embodiments, the current steering device 325 may include two or more layers of semiconductor material, such as two or more doped silicon layers, that are configured to allow or inhibit the current flow in different directions through the memory element 320 when that memory element is not selected to read.

In some embodiments, the current steering device 325 is a diode type current steering device that preferentially allows current to flow through the memory device 310 in a forward direction. However, a reduced current can also flow in the opposing direction through the device by the application of a reverse bias to the electrodes 330 and 340.

Figure 5:
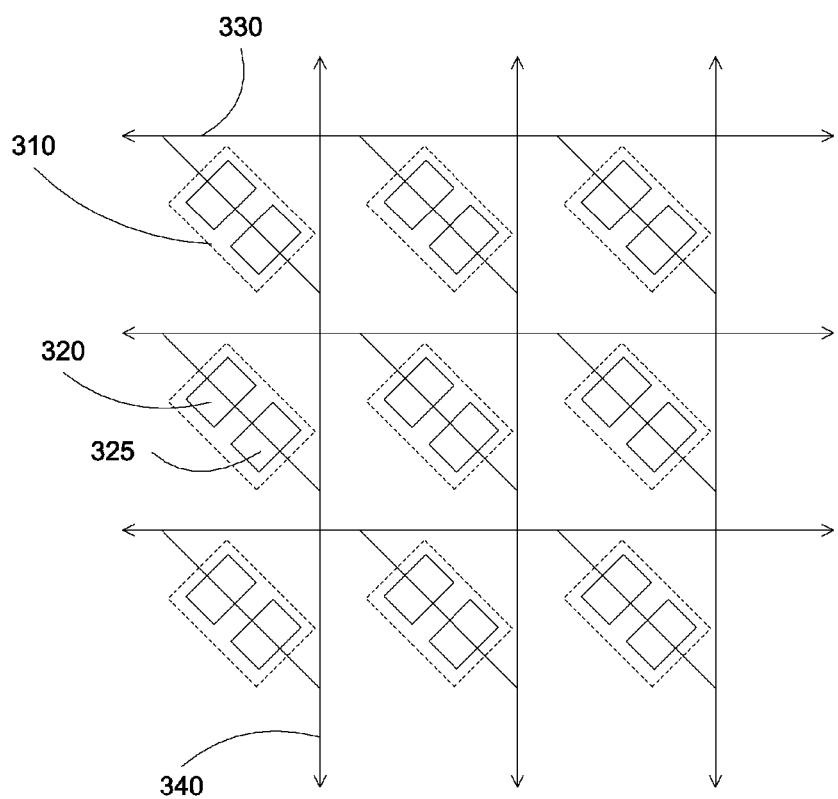
FIG. 5 illustrates an exemplary integrated memory circuit according to some embodiments of the present invention.

FIG. 5 illustrates an exemplary integrated memory circuit according to some embodiments of the present invention. An array of switching memory devices 310 is shown that are connected together to form part of a high-capacity nonvolatile memory integrated circuit. Each of the individual switching memory devices 310 can be accessed using appropriate sets of discrete word-lines and bit-lines, which, as noted above, may comprise at least a portion of the electrodes 330 and 340. Each of the switching memory devices 310 contains a memory element 320 and current steering device 325 (e.g., a diode type) that are connected to at least one of the electrodes 330 and at least one of the electrodes 340. The electrodes 330 and/or 340 are generally biased by circuitry that is connected at the periphery of the memory chip on which the array of memory devices 310 are formed.

During operation, such as a read operation, the state of a memory element 320 in the switching memory device 310 can be sensed by applying a sensing voltage (e.g., a "read" voltage VREAD), such as applying about +0.5 volts (V), to an appropriate set of electrodes 330 and 340. Depending on its history, a memory element that is addressed in this way may be in either a high resistance state (HRS) or a low resistance state (LRS). The resistance of the memory element 320 therefore determines what digital data is being stored by the memory element 320. If the memory element 320 is in the high resistance state, for example, the memory element may be said to contain a logic "one" (i.e., a "1" bit). If, on the other hand, the memory element is in the low resistance state, the memory element may be said to contain a logic "zero" (i.e., a "0" bit). During a write operation, the state of a memory element can be changed by application of suitable write signals to an appropriate set of electrodes 330 and 340.

In some embodiments, the memory element 320 uses bipolar switching where opposite polarity set and reset voltages are used to alter the resistance of the memory element between high and low resistance states. In one example, initially, memory element 320 may be in a high resistance state (e.g., storing a logic "zero"). The high resistance state of memory element 320 can be sensed by read and write circuitry 470 (FIG. 4) using electrodes 330 and 340. For example, read and write circuitry may apply a read voltage VREAD to memory element 320, and can sense the resulting "off" current (IOFF) that flows through memory element 320. When it is desired to store a logic "one" in memory element 320, memory element 320 can be placed into its low-resistance state. This may be accomplished by using read and write circuitry 470 to apply a set voltage VSET (e.g., −2 V to −4 V) across electrodes 330 and 340. In one configuration, applying a negative VSET voltage to memory element 320 causes memory element 320 to switch to its low resistance state. It is believed that the change in the resistive state of memory element 320 may be due to the redistribution or filling of traps or defects, in the resistive switching layer, or variable resistance metal oxide layer, when the device is reverse biased. The defects or traps, which are commonly formed during the deposition or initial burn-in or forming of the variable resistance metal oxide layer, are often created by a non-stoichiometric material composition found in the formed variable resistance metal oxide layer. VSET and VRESET are generally referred to as "switching voltages" herein.

The low resistance state of the memory element 320 can be sensed using the read and write circuitry 470. When a read voltage VREAD is applied to resistive switching memory element 320, the read and write circuitry 470 will sense the relatively high "on" current value (ION), indicating that memory element is in its low resistance state. When it is desired to store a logic "zero" in memory element, the memory element can once again be placed in its high resistance state by applying a positive reset voltage VRESET (e.g., +2 V to +5 V) to memory element. When read and write circuitry applies VRESET to memory element, memory element enters its high resistance state. When the reset voltage VRESET is removed from memory element 320, memory element will once again be characterized by high resistance when the read voltage VREAD is applied. Voltage pulses can be used in the programming of the memory element. For example, a 1 microseconds (ms) to 1 nanoseconds (ns) square or trapezoidal shaped pulse can be used to switch the memory element. In some embodiments, it may be desirable to adjust the length of the pulse depending on the amount of time needed to switch the memory element. In one example, the "set" and "reset" pulses are each about 10 ns in length. While the discussion of the memory element herein primarily provides bipolar switching examples, some embodiments of the memory element may use unipolar switching, where the set and reset voltages have the same polarity, without deviating from the scope of the invention described herein.

To provide a measurable difference between the logic "zero" and logic "one" states it is common to form the variable resistance layer and other memory element components so that the difference between the ION and IOFF currents have a difference of at least one order of magnitude (e.g., current ratio ION/IOFF≥10). In other words, the ratio of the electrical resistances of the variable resistance layer is decreased by at least 10 times when switching between the high and the low resistance states.

In an effort to prepare the memory element for use, it is common to apply a forming voltage (VFORM) at least once across the electrodes 330, 340 to "burn-in" the device. It is believed that the application of a forming voltage, which is typically significantly greater than the VRESET and VSET voltages, causes the defects that are formed within the variable resistance layer during the device fabrication process to move, align and/or collect within various regions of the formed layer, causing the variable resistance layer to consistently and reliably switch between the "on" and "off" resistive states throughout the memory element's life. In some embodiments, the forming voltage is between about 1 and about 5 times greater than the VRESET or VSET voltage. In some embodiments, the forming voltage is between about 1.4 and about 2.5 times greater than the VRESET or VSET voltage. In some embodiments, the forming voltage is between about 3 and about 7 volts. However, it is noted that in some cases it is desirable to form the memory element so that the application of a forming voltage is not required at all to assure that the device will perform as desired throughout its life.

Figure 6:
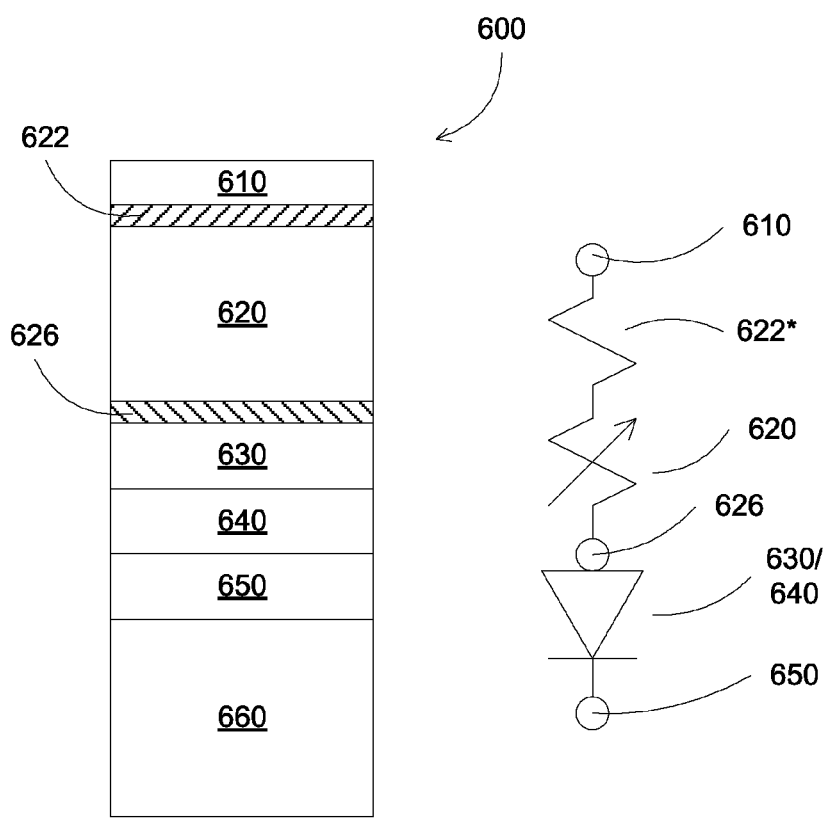
FIG. 6 illustrates an exemplary memory device according to some embodiments of the present invention.

FIG. 6 illustrates an exemplary memory device according to some embodiments of the present invention. A memory device 600 comprising a memory element and a current steering device such as a diode 630/640 is formed on substrate 660. The current steering device can comprise a p-n junction, for example, with a p-doped polysilicon layer 630 disposed on an n-doped polysilicon layer 640. Optional electrode 650 can be used for contact.

The memory element generally contains a top electrode 610 and metal oxide layer 620 acting as a variable resistance layer. In some embodiments, interface layer 626 interfacing the metal oxide layer 620 and the polysilicon 630, interface layer 622 interfacing the metal oxide layer 620 and the electrode 610, or both interface layers 622 and 626 are included. The interface layer 626 can comprise a metal-rich metal oxide or an oxygen-poor metal oxide to prevent oxidizing the polysilicon layer 630. In some embodiments, the interface layer 626 can be formed by a hydrogen plasma process during the first 5-10 ALD cycles of the metal oxide 620 deposition. The interface layer 622 can comprise a metal-poor metal oxide or an oxygen-rich metal oxide to form a current limiter resistor 622*. In some embodiments, the interface layer 622 can be formed by an oxygen plasma process during the last 5-20 ALD cycles of the metal oxide 620 deposition.

The metal oxide variable resistance layer 620 can be a dielectric material, such as a metal oxide material or other similar material that can be switched between at least two or more stable resistive states. In some embodiments, the variable resistance layer 620 is a high bandgap material (e.g., bandgap >4 electron volts (eVs)), such as hafnium oxide ($Hf_xO_y$), tantalum oxide ($Ta_xO_y$), aluminum oxide ($Al_xO_y$), lanthanum oxide ($La_xO_y$), yttrium oxide ($Y_xO_y$), dysprosium oxide ($Dy_xO_y$), ytterbium oxide ($Yb_xO_y$) or zirconium oxide ($Zr_xO_y$). It has been found that using high band gap variable resistance layer materials will improve data retention in the memory element, and reduce the leakage current in the formed memory element device, since the amount of trapped charge in the variable resistance layer material with a high band gap will be less than the amount of trapped charge in the variable resistance layer material with a lower band gap material, and the high band gap materials create a large barrier height that the carriers have to cross during the read, set and reset operations. In other embodiments, lower bandgap metal oxide materials can be used, such as titanium oxide ($TiO_x$), nickel oxide ($NiO_x$) or cerium oxide (CeOx) may be advantageous for some embodiments. In some cases, a semiconductive metal oxide (p-type or n-type) such as zinc oxides ($Zn_xO_y$), copper oxides ($Cu_xO_y$), or their nonstoichiometric and doped variants can be used. The variable resistance layer 620 may comprise a metal oxide (e.g., $HfO_2$) layer formed to a thickness of between about 10 and about 100 angstroms (Å).

Electrode materials 610 or 650 may include silicon, silicides, doped silicon (e.g. n-type or p-type polysilicon), titanium nitride (TiN), platinum, iridium, iridium oxide, ruthenium or ruthenium oxide. The electrodes are formed from conductive materials that have a desirable work function. According to some embodiments, one electrode may be a higher work function material, and the other electrode may be a lower work function material. For example, in one embodiment, at least one electrode is a high work function material such as a noble or near noble metal (i.e., a metal with a low absolute value (i.e., negative or positive) free energy change (|ΔG|) of oxide formation). Noble or near noble metals include iridium, iridium oxide, platinum, ruthenium, or ruthenium oxide. The other electrode may be a lower work function material such as titanium nitride, or may also be a noble or near noble material. In some embodiments, the reset pulse at the electrode having the higher work function is a positive pulse (i.e., the higher work function electrode is the anode of the memory element).

In other embodiments, the electrodes can be multi-layer electrodes that can include one or more different materials. For example, an electrode can include a layer of ruthenium and ruthenium oxide, or a layer of iridium, iridium oxide, or platinum with a capping layer of tungsten, tungsten carbonitride, or tungsten carbon. The multi-layer electrodes can be used to improve adhesion properties and performance of memory elements in some configurations and embodiments.

The insulator or semiconductor device layer of the MIM stack can also be constructed using multiple layers of oxides. The combination of oxides can be used to impart desired characteristics to memory cells. Other layers may also be used, such as for example, a defect access layer, or another electrical device such as an embedded transistor or diode (referred to below as a "current steering element"). Current steering elements may include, for example, diodes, p-i-n diodes, silicon diodes, silicon p-i-n diodes, transistors, etc. Current steering elements may be connected in series in any suitable location within or adjacent to the memory cell, including in between one of the electrodes and the remainder of a cell or oxide stack, referenced above. Current steering elements may be used to enhance operation or control of memory cells (or other semiconductor structures), depending on the application.

Figure 7:
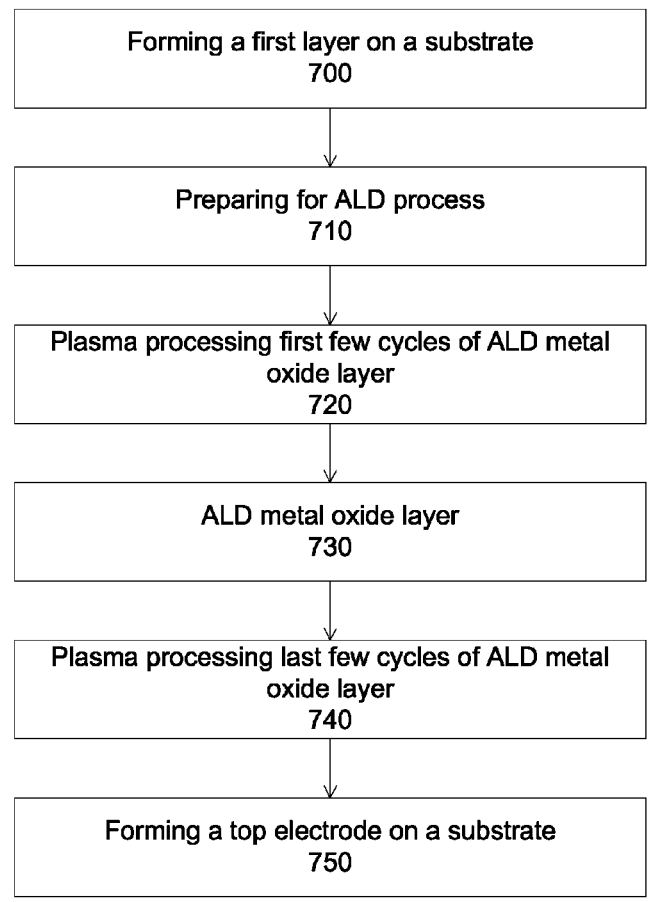
FIG. 7 illustrates an exemplary flowchart for forming a memory device according to some embodiments of the present invention.

FIG. 7 illustrates an exemplary flowchart for forming a memory device according to some embodiments of the present invention. The described flowchart is a general description of techniques used to form the memory elements described above. The flowchart describes techniques for forming a memory element generally including two electrodes and at least one layer of metal oxide disposed therebetween. Although certain processing techniques and specifications are described, it is understood that various other techniques and modifications of the techniques described herein may also be used.

In operation 700, a first layer is formed. The first layer can be formed on a substrate, for example, a silicon substrate that may include one or more layers already formed thereon. In some embodiments, the first layer can be a polysilicon layer, such as a doped polysilicon layer in a current steering diode. For example, the first layer can be a highly doped polysilicon layer that is formed using a conventional CVD or ALD type polysilicon deposition technique. In some cases, an optional native oxide layer removal step may be performed after forming the first layer by use of a wet chemical processing technique, or conventional dry clean process that is performed in a plasma processing chamber. It should be noted that the first layer may be provided on a substrate that may have the steering device and the electrode formed thereon as well. Alternatively, in the case where no steering device is provided, the depicted first layer is the bottom electrode. In one example, the first layer comprises polysilicon and is between about 50 and about 5000 angstroms (Å) thick.

In some embodiments, the first layer can be a first electrode which is formed over a signal line such as a bit line or a word line. The first electrode can be silicon, a silicide, titanium nitride, or other appropriate materials such as those described above. In one example, a titanium nitride electrode is formed using PVD or another process described above. For example, the first electrode can be sputtered by bombarding a metal target at 150-500 W with a pressure of 2-10 mTorr for a deposition rate of approximately 0.5-5 Å/s. These specifications are given as examples, the specifications can vary greatly depending on the material to be deposited, the tool used to deposit the material, and the desired speed of deposition. The duration of the bombardment can determine the thickness of the electrode. Other processing techniques, such as ALD, PLD, PVD, CVD, evaporation, etc. can also be used to deposit the first electrode. In some embodiments, the first electrode is in contact with one of the signal lines. The first electrode may have any thickness, for example 50 Å-5000 Å.

In operation 710, the substrate is prepared for ALD process, including being heated, for example by heating a pedestal on which the substrate is mounted in an ALD chamber. In this way, a pedestal temperature is maintained for an ALD deposition process so that the metal oxide layer(s) can be deposited. As is described further below, the pedestal temperature can be reduced below a pedestal temperature typically used for ALD processes (which may be, for example, 250° C.) to reduce the forming voltage of the resulting memory element. For example, the pedestal on which the substrate is mounted can be heated to and maintained at a temperature of less than 100° C. In some embodiments, the pedestal temperature is maintained throughout the formation of a metal oxide layer using ALD.

After preparing the substrate, a metal oxide layer is formed using ALD process. In operation 720, a first few cycles of the ALD process to form the metal oxide layer include a plasma process to engineer the contact interface with the underlayer. In some embodiments, the plasma process comprises an oxygen inhibitor reagent to eliminate or reduce oxidizing the underlayer.

In some embodiments, during the first few ALD cycles, for example, between 5 to 10 cycles, a hydrogen plasma is provided to reduce or neutralize the oxidation potential of the metal oxide deposition. For example, the plasma processing in the first few cycles can prevent oxidation of the underlayer, such as a metal electrode or a polysilicon layer.

In operation 730, at least one bulk metal oxide layer is formed using ALD. The metal oxide layer can be a resistive-switching metal oxide layer, such as a high bandgap (i.e. greater than 4 eV) material including hafnium oxide, aluminum oxide, yttrium oxide, or tantalum oxide, or can be another resistive-switching material such as titanium oxide. As mentioned above, ALD is a multi-step process used to deposit semiconductor layers. An ALD-deposited layer typically includes multiple cycles to deposit a layer of a desired thickness, so the process is repeated until the desired layer thickness has been deposited. The metal oxide layer can include single metal oxide (e.g. hafnium oxide or aluminum oxide), can use co-injection or nanolaminates to deposit a binary metal oxide, or can use multiple layers of metal oxides. For example, a hafnium oxide "base" layer can be deposited over a titanium oxide "diffusion barrier" layer. In other embodiments, three or more different layers of materials can be deposited.

In a typical ALD metal oxide formation, a first reagent is introduced to (e.g. flowed onto) a substrate (e.g. over the first electrode) by introducing the first reagent into an ALD chamber. The first reagent can be a metal-containing precursor that is used to form a metal oxide. For example, the first reagent can be trimethylaluminum (TMA) to deposit an aluminum oxide layer or a hafnium oxide layer can be deposited using hafnium precursors such as tetrakis (diethylamido) hafnium (TDEAHf), tetrakis (dimethylamido) hafnium (TDMAHf), tetrakis (ethylmethylamido) hafnium (TEMAHf) or hafnium chloride ($HfCl_4$). Other precursors, for example tetrakis (ethylmethylamino) zirconium (TEMAZ) to deposit zirconium oxide or tris(methylcyclopentadienyl)-yttrium (($Cp)_3$)Y to deposit yttrium oxide. In other embodiments, lower bandgap (i.e. less than 4 eV) materials, such as titanium oxide, have been shown to exhibit switching properties. Precursors such as tetraisopropoxide (TTIP) can be used to deposit titanium oxide.

The excess (unreacted portion) of the first reagent is purged, for example by purging the ALD chamber to remove excess precursor. The purge duration can be shorter than a typical purge duration for ALD, for example being between 5 and 20 seconds, 10 and 17 seconds, or 15 seconds, compared to a typical purge of 30 seconds. It is believed that the shortened purge duration can leave impurities in the film, creating defects and leading to a lower forming voltage. These impurities are desirable because they can create point defects in the deposited metal oxide layer.

A second reagent is introduced to the substrate. The second reagent combines with the first reagent to form a metal oxide. The second reagent is an oxidizer, for example ozone, water vapor, or oxygen. The second reagent forms an oxide of the metal contained in the first reagent (the precursor). The unreacted second reagent is then purged. This purge duration can also be shortened (e.g. to 5-20 seconds or 15 seconds), although a longer purge can also be used.

It is determined whether another ALD deposition cycle is to be performed. A typical ALD cycle may form a layer that is 0.5 Å, for example. To form a 50 Å metal oxide layer, 100 cycles would need to be performed. So, if it is determined that the desired number of cycles has been performed or that the desired thickness has been reached, the process continues. If more ALD cycles need to be completed, the sequence is repeated.

In some embodiments, an ALD process using tetrakis(dimethylamino)hafnium (TDMAH) and an oxygen containing precursor at a temperature of about 250° C. is used to form an 50 Å thick hafnium oxide ($Hf_xO_y$) containing metal oxide variable resistance layer.

In operation 740, a last few cycles of the ALD process to form the metal oxide layer include a plasma process to engineer the contact interface with the top electrode. In some embodiments, the plasma process comprises an oxygen plasma to oxidize the metal oxide layer, forming a current limiter.

In operation 750, a second electrode is deposited over the metal oxide layer. The second electrode may be, according to some embodiments, a noble or near-noble metal such as iridium, iridium oxide, platinum, ruthenium, or ruthenium oxide deposited using PVD, ALD, CVD, PLD, evaporation, or another suitable technique. A platinum top electrode can be deposited using PVD by sputtering a metal target at 100-500 W with a pressure of 2-10 mTorr for a deposition rate of 0.5-10 Å/s. The duration of the sputtering determines the thickness of the electrode. In other embodiments, a non-noble electrode can be deposited. As mentioned above, it is understood that specifications for performing the deposition depend on the material to be deposited, the desired deposition rate, the tool being used, and other factors.

After the memory element is formed, an initial voltage, the forming voltage, can be applied across the memory element to form the memory element. The forming voltage can be applied by increasing the voltage across the memory element until the memory element switches resistive states. The voltage at which it initially switches is the forming voltage. This forming voltage can be reduced (e.g. to less than 5.5V) as a result of the ALD processing techniques including the lower pedestal temperature and the shorter duration purge described herein.

Although the foregoing examples have been described in some detail for purposes of clarity of understanding, the invention is not limited to the details provided. There are many alternative ways of implementing the invention. The disclosed examples are illustrative and not restrictive.

What is claimed is:

1. A method of forming a resistive switching memory device, comprising
    forming a first layer on a substrate wherein the first layer is operable as a bottom electrode of the resistive switching memory device;
    forming a second layer above the first layer wherein the second layer comprises a metal oxide material deposited by a first ALD process, wherein the first ALD process comprises a first step of applying a metal-containing precursor and a second step of applying a hydrogen-containing plasma;
    forming a third layer above the second layer wherein the third layer is operable as a switching layer of the resistive switching memory device, wherein the third layer comprises a metal oxide material deposited by a second ALD process, wherein the second ALD process comprises a first step of applying the metal-containing precursor and a second step of applying an oxidant; and
    forming a fourth layer above the third layer wherein the fourth layer comprises a metal oxide material deposited by a third ALD process, wherein the third ALD process comprises a first step of applying the metal-containing precursor and a second step of applying an oxygen-containing plasma.

2. A method as in claim 1 further comprising depositing a top electrode on the fourth layer.

3. A method as in claim 1 wherein the first layer comprises polysilicon or metal.

4. A method as in claim 1 wherein the second layer comprises metal-rich or oxygen-poor metal oxide.

5. A method as in claim 1 wherein the second step of the first ALD process further comprises applying the oxidant.

6. A method as in claim 1 wherein the first ALD process for depositing the second layer comprises between 5 to 10 ALD cycles.

7. A method as in claim 1 wherein the oxidant comprises one of water, oxygen, atomic oxygen, nitrous oxide, nitric oxide, nitrogen dioxide, dinitrogen pentoxide, hydrogen peroxide, or ozone.

8. A method as in claim 1 wherein the second step of the third ALD process further comprises applying the oxidant.

9. A method as in claim 1 wherein the third ALD process for depositing the fourth layer comprises between 5 to 20 ALD cycles.

10. A method as in claim 1 wherein the fourth layer comprises one of stoichiometric, metal-poor, or oxygen-rich metal oxide.

* * * * *